United States Patent [19]

Schwalm et al.

[11] Patent Number: 5,075,199

[45] Date of Patent: Dec. 24, 1991

[54] RADIATION SENSITIVE MIXTURE AND PRODUCTION OF RELIEF PATTERNS

[75] Inventors: Reinhold Schwalm, Wachenheim; Horst Binder, Lampertheim, both of Fed. Rep. of Germany

[73] Assignee: BASF Aktiengesellschaft, Ludwigshafen, Fed. Rep. of Germany

[21] Appl. No.: 352,383

[22] Filed: May 16, 1989

[30] Foreign Application Priority Data

May 19, 1988 [DE] Fed. Rep. of Germany ....... 3817011

[51] Int. Cl.$^5$ .................. G03F 7/038; G03F 7/039; G03F 7/30; G03F 7/40
[52] U.S. Cl. ................... 430/281; 430/270; 430/325; 430/326; 522/31
[58] Field of Search .............. 522/31; 430/281, 270, 430/325, 326, 330, 287

[56] References Cited

U.S. PATENT DOCUMENTS

| 3,915,706 | 10/1975 | Limburg et al. | 96/27 R |
|---|---|---|---|
| 4,491,628 | 1/1985 | Ito et al. | 430/176 |
| 4,663,269 | 5/1989 | Narang et al. | 430/270 X |
| 4,678,737 | 7/1987 | Schneller et al. | 430/270 |
| 4,689,288 | 8/1988 | Buiguez et al. | 430/270 |
| 4,770,977 | 9/1988 | Buiguez et al. | 430/323 |
| 4,820,607 | 4/1989 | Aoai | 430/190 |

FOREIGN PATENT DOCUMENTS

| 3628046 | 2/1987 | Fed. Rep. of Germany . | |
| 62-38450 | 2/1987 | Japan | 430/270 |

OTHER PUBLICATIONS

W. S. DeForest, *Photo Resist: Materials and Processes*, (McGraw-Hill Book Company, New York, N.Y., 1975), pp. 213, 229–232.

Crivello, "Org. Coatings and Appl. Polym. Sci.", 48, pp. 65–69 (1985).
Stabb, "Angewandte Chemie, 12", pp. 407–423 (1962).
Pampalone, "Solid State Technology", Novolac Resins Used in Positive Resist Systems, Jun. 1984, pp. 115–120.
*Journal of Imaging Technology*, vol. 11, No. 4, Aug. 1985, pp. 146–157.

*Primary Examiner*—Cynthia Hamilton
*Attorney, Agent, or Firm*—Keil & Weinkauf

[57] ABSTRACT

A radiation sensitive mixture useful for producing relief patterns contains
(a) a polymeric binder which is insoluble in water but soluble in aqueous alkaline solutions and
(b) an organic compound whose solubility in an aqueous alkaline developer is increased by the action of acid and which contains at least one acid cleavable group and also a group which on irradiation forms a strong acid, wherein the polymeric binder (a) contains from 5 to 40 mol % of monomer units having

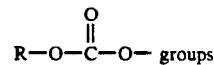

in copolymerized or cocondensed form or the

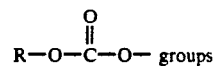

introduced by polymer analogous reaction with the proviso that the radical R contains from 5 to 9 carbon atoms.

10 Claims, No Drawings

RADIATION SENSITIVE MIXTURE AND PRODUCTION OF RELIEF PATTERNS

The present invention relates to positive working radiation sensitive mixtures which contain a binder which is soluble in aqueous alkali and contains up to 40% of hydrophobic comonomer units in copolymerized form, and a compound which contains at least one acid cleavable bond and on irradiation forms a strong acid, the solubility of the compound in an alkaline solvent being increased by the action of the acid. These mixtures are sensitive to UV rays, electron beams and X-rays and are suitable in particular for use as resist materials and for the production of relief patterns.

Positive working radiation sensitive mixtures are known. Commercially, use is made in particular of positive working resist materials which contain o-quinonediazides in binders, for example novolaks, which are soluble in aqueous alkali. However, the sensitivity of these systems to radiation, in particular shortwave radiation, is not always satisfactory.

Sensitivity increases in radiation sensitive systems which in the primary photoreaction produce a species which then, independently of the radiation, initiates a catalytic secondary reaction have been described. U.S. Pat. No. 3,915,706 describes for example photoinitiators which produce a strong acid which in a secondary reaction then cleaves acid labile groups, such as polyaldehyde groups.

The prior art (for example DE-A-3,406,927) also discloses radiation sensitive mixtures based on acid cleavable compounds which contain as the binder a polymer which is soluble in aqueous alkali, a compound which photochemically forms a strong acid, and a further compound containing acid cleavable bonds, which by the action of the acid become more soluble in an alkaline developer. Compounds mentioned as photochemically forming a strong acid are diazonium, phosphonium, sulfonium and iodonium compounds and also halogen compounds. The use of these onium salts as photochemical acid donors in resist materials is also known for example from U.S. Pat. No. 4,491,628. A review of the use of onium salts in resist materials is given by Crivello in Org. Coatings and Appl. Polym. Sci. 48 (1985), 65-69. The disadvantage with these photoinitiators is that, aside from the acid formed, irradiation does not give rise to any photoproducts which increase the solubility in the alkaline developer. Furthermore, these mixtures of necessity require three components.

Radiation sensitive mixtures of polymers having acid labile side groups and photochemical acid donors are known for example from U.S. Pat. No. 4,491,628 and FR-A-2,570,844. However, these polymeric binders are hydrophobic and only become alkali soluble on irradiation. The polymers have thus been designed in such a way that the action of acid brings about a large differentiation in the polarity. They therefore contain repeat units with acid labile groups, so that the elimination of these groups entails a large loss of substance.

DE-A-3,721,741 proposes radiation sensitive mixtures which contain a polymeric binder which is soluble in aqueous alkaline solutions and an organic compound whose solubility in an aqueous alkaline developer is increased by the action of acid, which contains at least one acid cleavable group, and which on irradiation produces a strong acid. However, these systems have disadvantages for certain applications. In these systems, the organic compound has two functions, namely to reduce the solubility of the polymeric binder prior to irradiation and to raise it after irradiation and, secondly, the compound must be radiation sensitive. However, for certain applications it is advantageous to reduce the proportion of photoactive organic compound, for example in order to obtain a higher transparency in the shortwave UV field (in the region of 250 nm), so that the function of solubility inhibition must be boosted by other measures.

It is an object of the present invention to provide highly reactive radiation sensitive systems for relief structure production which are developable with aqueous alkaline solutions and make possible the production of light sensitive layers of high transparency to short-. wave UV without excessive loss of substance.

We have found, surprisingly, that this object is very advantageously achieved by the incorporation of alkyl carbonate groups of from 5 to 9 carbon atoms in the alkyl group.

The present invention accordingly provides a radiation sensitive mixture containing (a) a polymeric binder which is insoluble in water but soluble in aqueous alkaline solutions and (b) an organic compound whose solubility in an aqueous alkaline developer is increased by the action of acid and which contains at least one acid cleavable group and also a group which on irradiation forms a strong acid, wherein the polymeric binder (a) contains from 5 to 40 mol % of monomer units having

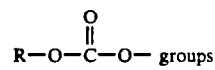

in copolymerized or cocondensed form or the

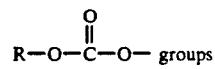

introduced by polymer analogous reaction, with the proviso that the radical R contains from 5 to 9 carbon atoms.

Particular preference here is given to radiation sensitive mixtures containing polymeric binders (a) based on polymers of p-hydroxystyrene and/or p-hydroxy-α-methylstyrene, whose phenolic hydroxyl groups have been replaced by $C_5$-$C_9$-alk(en)yloxycarbonyloxy radicals to an extent of from 5 to 40 mol %, and novolaks based on p-cresol and formaldehyde in which from 5 to 40 mol % of the p-cresol units have been replaced by. group of the formula

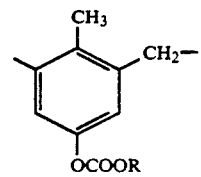

where R is alkyl, alkenyl, alkynyl, cycloalkyl or cycloalkenyl each of from 5 to 9 carbon atoms.

Preferred organic compounds (b) are sulfonium salts of the general formula (I)

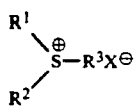

$R^1$, $R^2$ and $R^3$ are identical to or different from one another and each is singly acyclyl or aryl which may each contain heteroatoms, or two of $R^2$ to $R^3$ together form a ring, with the proviso that at least one of $R^1$ to $R^3$ contains at least one acid cleavable group, one of $R^1$ to $R^3$ can be bonded to one or more further sulfonium salt residues directly or via acid cleavable groups, and $X^\ominus$ is a nonnucleophilic counterion.

The present invention also provides a process for producing relief patterns and relief images where the light sensitive coating material is a radiation sensitive mixture according to the invention.

Preferably, irradiation of the radiation sensitive mixture is followed by heating at from 60° to 120° C.

The radiation sensitive mixtures according to the invention are notable for high transparency in the wavelength region around 250 nm, high sensitivity to shortwave UV radiation (<300 nm) and good resistance to fluorine containing etching gases. They are therefore ideally suited for application in deep UV lithography. The polymers (a) according to the invention are particularly advantageously usable as binders in photoresists, since they effect good surface quality, minimal depletion in the unexposed areas and development without resolution limiting swelling.

There now follow specifics concerning the buildup components of the mixture according to the invention.

a) The polymeric binders which are insoluble in water but soluble in aqueous alkaline solutions are preferably phenolic resins, e.g. novolaks, poly(p-hydroxystyrenes), poly(p-hydroxy-α-methylstyrenes) or copolymers of p-hydroxystyrene and p-hydroxy-α-methylstyrene, with lateral $C_5$–$C_9$-alkyl carbonate groups.

For instance, such alkyl carbonate containing polymers can conform to the following general formula (II):

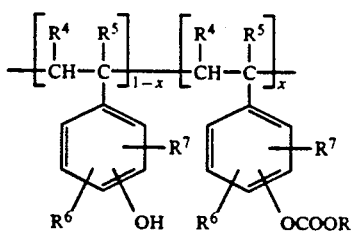

where R is an alcohol residue of the general formula (III)

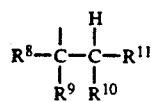

and $R^4$ is H, halogen (for example chlorine) or $C_1$–$C_3$-alkyl, $R^5$ is H or $C_1$–$C_4$-alkyl, $R^6$ and $R^7$ are each H, halogen (for example chlorine), $C_1$–$C_4$-alkyl or $C_1$–$C_4$alkoxy, and $R^8$–$R^{11}$ are each H, alkyl, alkenyl or alkynyl, with the proviso that the number of carbon atoms of the radical R is from 5 to 9, two of $R^8$–$R^{11}$ can form a ring, and x is from 0.05 to 0.4.

It is also possible to use p-cresol/formaldehyde novolaks whose p-cresol units have been replaced to an extent of from 5 to 40 mol % by

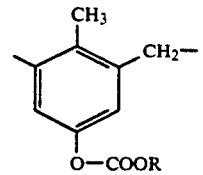

where R is as defined above.

Preference is given to spherically bulky alcohol residues R-O- of from 5 to 9, in particular from 5 to 7, carbon atoms, which can also be ethylenically or acetylenically unsaturated, for example cyclohexyloxy, 1-methylcyclohexyloxy, 2-methyl-3-buten-2-oxy, 2-methylbutan-2-oxy, 2-methylhexan-2-oxy, 3-methyl-1-penten-3-oxy, 3-methylpentan-3-oxy, 2-methylpentan-2-oxy, 3-methyl-2-butanol and 2-methyl-3-butyn-2-oxy radicals.

Suitable novolaks are basically those described for example in Novolak Resins Used in Positive Resist Systems by T. Pampalone in Solid State Technology, June 1984, 115–120.

For specific applications, for example exposure in shortwave UV, preferred novolaks are made from p-cresol and formaldehyde. These novolaks can then be reacted for example with di-t-amyl dicarbonate in the presence of potassium t-butoxide in for example tetrahydrofuran in such a way that from 5 to 40 mol % of phenolic groups are converted.

Phenolic resins based on hydroxystyrenes can be copolymerized in a conventional manner from a plurality of unsaturated monomers by a free radical or ionic mechanism. Unsaturated components which are preferably copolymerized are for example substituted and unsubstituted hydroxystyrenes, such as p-hydroxystyrene, m-hydroxystyrene, p-(2-methylhexan-2-oxycarbonyloxy)styrene, p-(t-amyloxycarbonyloxy)styrene, p-hydroxy-α-methylstyrene and p-(cyclohexyloxycarbonyloxy)-α-methylstyrene.

These hydroxystyrene based polymers to be used according to the invention can likewise be prepared by polymer analogous reaction of for example poly(p-hydroxystyrene) with the corresponding stoichiometric amounts of dialkyl pyrocarbonates, alkyl chlorocarbonates or alkyl imidazole N-carboxylates, the alkyl groups of these compounds each having from 5 to 9 carbon atoms.

The tertiary alcohols in particular are preferably reactable by the last mentioned method by first preparing the alkyl imidazole-N-carboxylates by a method due to H. Staab in Angew. Chem. 12 (1962), 407–423, and then reacting them at elevated temperature in the presence or absence of catalytic amounts of alcoholate or sodium imidazole with for example poly-p-hydroxystyrene or poly-p-hydroxy-α-methylstyrene in a polymer analogous reaction.

Reaction with alkyl chlorocarbonates is customarily carried out in the presence of bases, for example pyridine, in a conventional manner.

To introduce the alkyl carbonate group having from 5 to 9 carbon atoms in the alkyl group, furthermore, poly(p-hydroxystyrene) for example can be reacted with the corresponding stoichiometric amount of a dialkyl pyrocarbonate by dissolving poly(p-hydroxystyrene) in tetrahydrofuran and adding the corresponding amount of potassium t-butoxide, followed for example by t-amyl pyrocarbonate dropwise in the form of a solution in tetrahydrofuran. The polymer according to the invention can be isolated by precipitation in water and be purified by repeated redissolving and reprecipitation.

According to the invention, the polymeric binder (a) contains from 5 to 40, preferably from 10 to 30, mol % of monomer units having

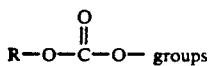

in copolymerized or cocondensed form or the

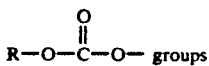

introduced in a corresponding amount by polymer analogous reaction.

The composition of the copolymers is advantageously determined by thermogravimetric analysis and H-NMR spectroscopy.

The invention is not limited to the abovementioned copolymers; on the contrary, it is possible to use any alkali soluble copolymer of p-hydroxystyrene which according to the invention contains hydrophobic comonomers having

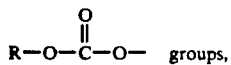

but preference is given to those copolymers which contain as a further comonomer unit a p-hydroxystyrene derivative in which the phenolic OH group is protected by an alkyl carbonate where the alkyl contains from 5 to 9 carbon atoms.

The polymeric binder (a) is in general present in the radiation sensitive mixture according to the invention in an amount of from 70 to 98, preferably from 80 to 95, % by weight, based on the total amount of (a)+(b). (b) The preferred organic compounds (b) are those which contain at least one sulfonium salt group and at least one t-butyl carbonate group or at least one silyl ether group. However, it is also possible to use other compounds which form a strong acid on irradiation and contain an acid cleavable bond in the same molecule.

Preferred organic compounds (b) are those of the general formula (I)

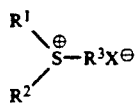 (I)

where $R^1$, $R^2$ and $R^3$ are identical to or different from one another and each is singly acyclyl or aryl which may each contain heteroatoms, or two of $R^1$ to $R^3$ together form a ring, with the proviso that at least one of $R^1$ to $R^3$ contains at least one acid cleavable group, one of $R^1$ to $R^3$ can be bonded to one or more further sulfonium salt residues directly or via acid cleavable groups, and $X^\ominus$ is a nonnucleophilic counterion, for example a dimethyl-4-t-butoxycarbonyloxyphenylsulfonium salt with hexafluoroarsenate, hexafluoroantimonate, hexafluorophosphate and/or hexafluoroborate as counterion, a phenylbis(4-t-butoxycarbonyloxyphenyl)sulfonium salt with the counterions mentioned, a tris(4-t-butoxycarbonyloxyphenyl)sulfonium salt with the counterions mentioned, a 4-hydroxyphenylbis(4-t-butoxycarbonyloxyphenyl)sulfonium salt with the counterions mentioned or a 1-naphthyl-4-trimethylsilyloxytetramethylenesulfonium salt with the counterions mentioned.

Particularly preferred organic compounds (b) of this type are those of the general formula (IV)

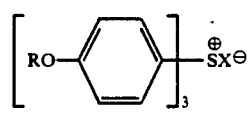 (IV)

where R can be H, t-butoxycarbonyl or trialkylsilyl, with the proviso that at least one of the radicals R is≠H.

The synthesis of the organic compounds (b) is described for example in DE-A-3,721,741 and DE-A-3,721,740.

Component (b) is in general present in the radiation sensitive mixture according to the invention in an amount of from 2 to 30, preferably from 5 to 20, % by weight, based on the total amount of the weight percentages of (a) and (b).

The radiation sensitive mixtures according to the invention are sensitive to X-rays, electron beams and UV radiation. If desired, sensitizers can be added in small amounts, such as pyrene and perylene, in order to sensitize the compounds in from the longer wave UV to the visible wavelength region. Irradiation in specific wavelength regions, for example in the shortwave UV region (<300 nm), requires a high transparency of the layers at the particular irradiation wavelength. Conventional exposure units based on mercury lamps make use of the 254 nm line, and excimer lasers emit at 248 nm (KrF). Radiation sensitive recording materials should therefore have very low optical densities in this region.

By means of the alkali soluble binders to be used according to the invention, which contain from 5 to 40 mol % of hydrophobic comonomers with $C_5$–$C_9$-alkyl carbonate groups, it is possible to obtain low optical densities in the wavelength region around 250 nm, since the proportion of solubility inhibiting components (b) can be for example reduced compared with poly-p-hydroxystyrene without lateral hydrophobic groups.

The loss of substance is significantly reduced compared with the polymers described in U.S. Pat. No. 4,491,628.

The proportion of the hydrophobic monomer unit can be reduced in a particularly advantageous manner to proportions distinctly below 40% if the hydrophobic $C_5$–$C_9$-alkyl carbonate groups contain sterically bulky alcohol residues, for example t-amyl, cyclohexyl, methylhexyl or methylpentyl.

In the novel process for producing relief patterns, a radiation sensitive recording layer consisting essentially of the radiation sensitive mixture according to the invention is subjected to imagewise exposure at such a rate that, following a thermal bake at from 60° C. to 120° C., the solubility of the exposed areas in aqueous alkaline solvent increases and that these areas can be selectively removed with the alkaline developer.

Preferably, for example the polymeric binder (a) and from 2 to 30% by weight, particularly preferably from 5 to 20% by weight, of a compound of type (b), based on the total weight of the compounds (a) and (b), are dissolved in methylglycol acetate or methyl propylene glycol acetate, the solids content of the solution being advantageously from 10 to 30% by weight. The solution can be filtered through a filter having a pore diameter of 0.2 μm. This resist solution can be spincoated at from 1000 to 10,000 rpm onto a wafer to form a resist film. The wafer is then preferably heated at 90° C. or 80° C. for from 1 to 5 minutes. The films can then be irradiated through a chromium coated structured quartz mask with UV light from a mercury lamp, with excimer laser light, with electron beams or with X-rays, and the irradiated films can be baked at from 60° C. to 120° C. for from 5 seconds to 2 minutes. The films thus treated are then developed with alkaline developers in the presence or absence of an alcohol, and the exposed areas dissolve away selectively while only little depletion takes place in the unexposed areas.

In the Examples and Comparative Examples, parts and percentages are by weight.

EXAMPLE 1

A photoresist solution is prepared from 10 parts of tris(4-t-butoxycarbonyloxyphenyl)sulfonium hexafluoroarsenate, 90 parts of a copolymer of 70 mol % of p-hydroxystyrene and 30 mol % of p-tert-amyloxycarbonyloxystyrene ($\overline{M}_w$ (light scattering) 65,000 g/mol) and 400 parts of methyl propylene glycol acetate. The solution is filtered through a filter having a pore diameter of 0.2 μm and spincoated in a layer thickness of about 1.0 μm (dry) onto a silicon wafer bearing an SiO₂ film. The wafer is dried at 90° C. for 1 minute and then brought into contact with an image structured test mask and irradiated for 3 seconds with excimer laser light of the wavelength 248 nm. It is then heated at 80° C. for 60 seconds and developed with a pH 13.00 developer for 30 seconds. The exposed areas have been completely removed, while no depletion is measured in the unexposed areas with an α-step profilometer from Tencor. The resist patterns show vertical side walls.

COMPARATIVE EXAMPLE 1

A photoresist solution is prepared from 10 parts of tris(4-t-butoxycarbonyloxyphenyl)sulfonium hexafluoroarsenate, 90 parts of poly(p-hydroxystyrene) ($\overline{M}_w$ (light scattering) 62,000 g/mol) and 400 parts of methyl propylene glycol acetate. Example 1 is repeated. Again the exposed areas are completely removable during the 30 seconds' development time, while, however, the unexposed areas suffer appreciable depletion (52%).

To reduce the depletion in the unexposed areas, the proportion of sulfonium salts can be increased. For this reason, a photoresist solution was prepared from 20 parts of tris(4-t-butoxycarbonyloxyphenyl)sulfonium hexafluoroarsenate, 80 parts of poly(p-hydroxystyrene) and 300 parts of methyl propylene glycol acetate. The optical density of a 1 μm thick layer is 1.05. Example 1 is repeated, except that 11 seconds' irradiation is necessary to ensure the complete removal of the exposed areas under the same conditions. The resist profiles, in addition, have inclined edges.

COMPARATIVE EXAMPLE 2

This Comparative Example shows that the use of commercial sulfonium salts (without acid labile groups) likewise does not meet the desired reduction in dark depletion to values smaller than 5%.

A photoresist solution is prepared from 10 parts of triphenylsulfonium hexafluoroarsenate, 90 parts of copolymer of 70 mol % of p-hydroxystyrene and 30 mol % of t-amyloxycarbonyloxystyrene mentioned in Example 1 and 400 parts of methyl propylene glycol acetate. The solution is filtered through a filter having a pore diameter of 0.2 μm and spincoated in a layer thickness of 1.03 μm onto a silicon wafer bearing an SiO₂ film. The wafer is dried at 90° C. for one minute and then treated with a pH 13.0 developer for 30 seconds. Appreciable depletion takes place in the unexposed areas (26%).

EXAMPLE 2

A photoresist solution is prepared from 10 parts of tris(4-t-butoxycarbonyloxyphenyl)sulfonium hexafluorophosphate, 90 parts of a copolymer of 80 mol % of p-hydroxystyrene and 20 mol % of p-2-methylhexyl-2-oxycarbonyloxystyrene (Fikentscher K value (measured in ethyl acetate): 30.5) and 400 parts of methyl propylene glycol acetate and is filtered through a filter having a pore size of 0.2 μm. The photoresist solution is spin-coated onto a silicon wafer in a layer thickness of about 1 μm. The wafer is then heated at 80° C. for 5 minutes and brought into contact with a structured test mask and irradiated for 10 seconds with excimer laser light of the wavelength 248 nm. It is then heated at 80° C. for 60 seconds and developed with an alkaline developer of pH 12.5 for 60 seconds. Good resist structures are obtained, and there is no measurable depletion in the unexposed areas.

EXAMPLE 3

A photoresist solution is prepared by dissolving 10 parts of tris(4-t-butoxycarbonyloxyphenyl)sulfonium hexafluoroarsenate and 90 parts of a copolymer of 75 mol % of p-hydroxystyrene and 25 mol % of p-cyclohexyloxycarbonyloxystyrene (Fikentscher K value (measured in ethyl acetate): 26) in 400 parts of ethylcellosolve acetate, and the solution is filtered through a filter of pore size 0.2 μm.

The resist solution is spincoated onto a silicon wafer in a layer thickness of 1 μm. It is baked at 80° C. for 5 minutes and then brought into contact with a test mask and irradiated for 3 seconds with excimer laser light of the wavelength 248 nm. Heating at 90° C. for 60 seconds is followed by 30 seconds' development with an alkaline developer of pH 12.10. The exposed areas have been completely removed, while the depletion in the unexposed areas is less than 2%.

EXAMPLE 4

Example 3 is repeated, except that the polymer used is a copolymer of 88 mol % of p-hydroxystyrene and 12 mol % of p-(t-amyloxycarbonyloxy)styrene ($\overline{M}_w$ (light scattering) 45,000 g/mol). The depletion in the unexposed areas is about 7%. Resist patterns of good quality are obtained.

We claim:

1. A radiation sensitive mixture containing
   (a) a polymeric binder which is insoluble in water but soluble in aqueous alkaline solutions and (b) an organic compound whose solubility in an aqueous alkaline developer is increased by the action of acid and which contains at least one acid cleavable group and also a group which on irradiation forms a strong acid, wherein the polymeric binder (a) contains from 5 to 40 mol % of monomer units having

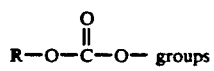

in copolymerized or cocondensed form or the

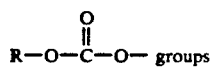

introduced by polymer analogous reaction, with the proviso that the radical R contains from 5 to 9 carbon atoms.

2. A radiation sensitive mixture as recited in claim 1, wherein the polymeric binder (a) used in poly(p-hydroxystyrene), poly(p-hydroxy-α-methylstyrene) or a copolymer of p-hydroxystyrene and p-hydroxy-α-methylstyrene, with the proviso that from 5 to 40 mol % of the p-hydroxy(α-methyl)styrene units carry a $C_5$-$C_9$-alk(en)yloxycarbonyloxy radical in place of the phenolic hydroxyl group.

3. A radiation sensitive mixture as recited in claim 1, wherein the polymeric binder (a) used is a novolak based on p-cresol and formaldehyde in which from 5 to 40 mol % of the cocondensed p-cresol units have been replaced by groups of the formula

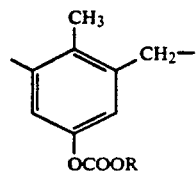

where R is alkyl, alkenyl, alkynyl, cycloalkyl or cycloalkenyl each of from 5 to 9 carbon atoms.

4. A radiation sensitive mixture as recited in claim 1, wherein the organic compound (b) is sulfonium salt of the general formula (I)

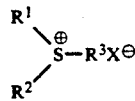 (I)

where $R^1$, $R^2$ and $R^3$ are identical to or different from one another and each is singly acyclyl or aryl which may each contain heteroatoms, or two of $R^1$ to $R^3$ together form a ring, with the proviso that at least one of $R^1$ to $R^3$ contains at least one acid cleavable group, one of $R^1$ to $R^3$ can be bonded to one or more further sulfonium salt residues directly or via acid cleavable groups, and $X^\ominus$ is a nonnucleophilic counterion.

5. A radiation sensitive mixture as recited in claim 2, wherein the organic compound (b) is sulfonium salt of the general formula (I)

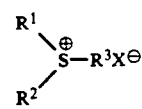 (I)

where $R^1$, $R^2$ and $R^3$ are identical to or different from one another and each is singly acyclyl or aryl which may each contain heteroatoms, or two of $R^1$ to $R^3$ together form a ring, with the proviso that at least one of $R^1$ to $R^3$ contains at least one acid cleavable group, one of $R^1$ to $R^3$ can be bonded to one or more further sulfonium salt residues directly or via acid cleavable groups, and $X^\ominus$ is a nonnucleophilic counterion.

6. A radiation sensitive mixture as recited in claim 3, wherein the organic compound (b) is sulfonium salt of the general formula (I)

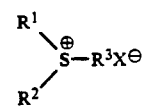 (I)

where $R^1$, $R^2$ and $R^3$ are identical to or different from one another and each is singly acyclyl or aryl which may each contain heteroatoms, or two of $R^1$ to $R^3$ together form a ring, with the proviso that at least one of $R^1$ to $R^3$ contains at least one acid cleavable group, one of $R^1$ to $R^3$ can be bonded to one or more further sulfonium salt residues directly or via acid cleavable groups, and $X^\ominus$ is a nonnucleophilic counterion.

7. A process for producing relief pattern and relief images, which comprises spin-coating a solution of a radiation sensitive mixture as recited in claim 1 onto a wafer to form a resist film, drying the coated wafer by heating, exposing the coated dried wafer imagewise with X-rays, electron beams or UV radiation, heating the exposed film and developing with an aqueous-alkaline solvent.

8. A process for producing relief patterns as recited in claim 7, wherein irradiation of the radiation sensitive mixture is followed by heating at from 60° to 120° C.

9. A process for producing relief pattern and relief images, which comprises spin-coating a solution of a radiation sensitive mixture as recited in claim 2 onto a wafer to form a resist film, drying the coated wafer by heating, exposing the coated and dried wafer imagewise with X-rays, electron beams or UV radiation, heating the exposed film and developing with an aqueous-alkaline solvent.

10. A process for producing relief pattern and relief images, which comprises spin-coating a solution of a radiation sensitive mixture as recited in claim 3 onto a wafer to form a resist film, drying the coated wafer by heating, exposing the coated and dried wafer imagewise with X-rays, electron beams or UV radiation, heating the exposed film and developing with an aqueous-alkaline solvent.

* * * * *